US007023033B2

(12) United States Patent
Harada et al.

(10) Patent No.: US 7,023,033 B2

(45) Date of Patent: Apr. 4, 2006

(54) LATERAL JUNCTION FIELD-EFFECT TRANSISTOR

(75) Inventors: Shin Harada, Osaka (JP); Kenichi Hirotsu, Osaka (JP); Hiroyuki Matsunami, Yawata (JP); Tsunenobu Kimoto, Kyoto (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/362,345

(22) PCT Filed: Jun. 11, 2002

(86) PCT No.: PCT/JP02/05816

§ 371 (c)(1), (2), (4) Date: Feb. 21, 2003

(87) PCT Pub. No.: WO02/103807

PCT Pub. Date: Dec. 27, 2002

(65) Prior Publication Data

US 2003/0168704 A1 Sep. 11, 2003

(30) Foreign Application Priority Data

Jun. 14, 2001 (JP) ............................ 2001-180173
Nov. 14, 2001 (JP) ............................ 2001-348882

(51) Int. Cl.
*H01L 29/808* (2006.01)

(52) U.S. Cl. ...................... 257/287; 257/286; 257/285; 257/266; 257/268

(58) Field of Classification Search ................. 257/287
See application file for complete search history.

(56) References Cited

U.S. PATENT DOCUMENTS

| | | | | |
|---|---|---|---|---|
| 4,185,291 | A | 1/1980 | Hirao et al. | |
| 4,485,392 | A * | 11/1984 | Singer | 257/272 |
| 4,876,579 | A * | 10/1989 | Davis et al. | 257/270 |
| 5,264,713 | A | 11/1993 | Palmour | |
| 5,319,227 | A * | 6/1994 | Lapham et al. | 257/270 |
| 5,378,642 | A | 1/1995 | Brown et al. | |
| 6,285,046 | B1 * | 9/2001 | Kaminski et al. | 257/263 |

FOREIGN PATENT DOCUMENTS

| | | |
|---|---|---|
| DE | 19844531 | 4/2000 |
| JP | 06084948 | 3/1994 |
| JP | 07030111 | 1/1995 |

* cited by examiner

*Primary Examiner*—Jerome Jackson
(74) *Attorney, Agent, or Firm*—W. F. Fasse; W. G. Fasse

(57) ABSTRACT

A lateral JFET has a basic structure including an n-type semiconductor layer (3) formed of an n-type impurity region and a p-type semiconductor layer formed of a p-type impurity region on the n-type semiconductor layer (3). Moreover, in the p-type semiconductor layer, there are provided a $p^+$-type gate region layer (7) extending into the n-type semiconductor layer (3) and containing p-type impurities of an impurity concentration higher than that of the n-type semiconductor layer (3) and an $n^+$-type drain region layer (9) spaced from the $p^+$-type gate region layer (7) by a predetermined distance and containing n-type impurities of an impurity concentration higher than that of the n-type semiconductor layer (3). With this structure, the lateral JFET can be provided that has an ON resistance further decreased while maintaining a high breakdown voltage performance.

6 Claims, 5 Drawing Sheets

LATERAL JUNCTION FIELD-EFFECT TRANSISTOR

TECHNICAL FIELD

The present invention relates to lateral junction field-effect transistors, and particularly to a lateral junction field-effect transistor having an ON resistance which can be decreased while maintaining a satisfactory breakdown voltage performance.

BACKGROUND ART

A junction field-effect transistor (hereinafter referred to as JFET) has a pn junction provided on either side of a channel region where carriers are passed therethrough, and a reverse bias voltage is applied from a gate electrode to extend a depletion layer from the pn junction into the channel region to control the conductance of the channel region and carry out such an operation as switching. In particular, a lateral JFET refers to the one having a channel region through which carriers move in parallel with the surface of the device.

The carriers in the channel may be electrons (n-type) or holes (p-type). A JFET having a semiconductor substrate of SiC usually has a channel region which is an n-type impurity region. For convenience of the following description, therefore, it is supposed that carriers in the channel are electrons and accordingly the channel region is an n-type impurity region, however, it should be understood that the channel region may be a p-type impurity region.

FIG. 7 shows a cross section of a conventional lateral JFET (U.S. Pat. No. 5,264,713 entitled "Junction Field-Effect Transistor Formed in Silicon Carbide"). On a p-type SiC substrate 110, a $p^+$-type epitaxial layer 112 is provided on which an $n^-$-type channel layer 114 is formed. On channel layer 114, an n-type source region 116 and an n-type drain region 118 are provided on respective sides of a trench 124 located therebetween, and a source electrode 120 and a drain electrode 122 are provided respectively on the source region and the drain region. On the back surface of SiC substrate 110, a gate contact layer 130 is formed on which a gate electrode (not shown) is provided. Trench 124 is provided with its depth extending through source/drain regions 116 and 118 to enter channel layer 114. Between the bottom of trench 124 and epitaxial layer 112 of a first conductivity type, a channel C is formed in epitaxial layer 114 of a second conductivity type.

The concentration of p-type impurities in epitaxial layer 112 is higher than the concentration of the n-type in epitaxial layer 114 which includes the channel, and thus a reverse bias voltage applied to the junction extends a depletion layer toward the channel. The depletion layer then occupies the channel to prevent current from passing through the channel and accordingly cause an OFF state. Control is thus possible to cause or not to cause the channel region to be occupied by the depletion layer by adjusting the magnitude of the reverse bias current. Then, ON/OFF control of current is possible by adjusting the reverse bias voltage between, for example, the gate and source.

For ON/OFF control of a large current, it is highly desirable to reduce an ON resistance in order to decrease the power consumption, for example. If the ON resistance is reduced by increasing the thickness of the channel or the impurity concentration of the channel layer, however, a problem of deterioration in breakdown voltage performance occurs.

FIG. 8 shows the channel, source, drain and gate for illustrating a breakdown voltage performance of the lateral JFET. FIG. 9 illustrates an electric field distribution between the drain and gate at a breakdown voltage. The electric field distribution shown in FIG. 9 refers to an electric field distribution in the n-type epitaxial layer that extends from the p-type epitaxial layer to the drain electrode. Emax in FIG. 9 represents a breakdown electric field when the depletion layer has a distance W from the drain to the pn junction. Emax may be represented by expression (1) below, where q represents an elementary charge, Nd represents an n-type impurity concentration in the region from the drain electrode to the pn junction, and ∈s represents a dielectric constant of the semiconductor.

$$Emax=qNdW/\in s \quad (1)$$

With the source grounded, the drain-gate voltage is at its maximum when breakdown occurs. Accordingly, a breakdown voltage Vb, i.e., withstand voltage is represented by following expressions (2)–(4), where Vdgmax represents the maximum voltage applicable to the region between the drain and the gate, and Vgs represents a gate-source voltage necessary for causing an OFF state.

$$Vb=Vdg\text{max}-Vgs \quad (2)$$

$$Vdg\text{max}=qNdW2/(2\in s) \quad (3)$$

$$Vgs=qNdh2/(2\in s) \quad (4)$$

There are two direct methods as described below for reducing the ON resistance. For the two methods each, it will be considered whether or not the breakdown voltage performance is enhanced, namely whether or not Vb increases.

(a) The channel thickness h is increased (without changing the impurity concentration).

Vgs increases as seen from expression (4) and accordingly Vb decreases as determined by expression (2), which means that the breakdown voltage performance is deteriorated.

(b) The n-type impurity concentration Nd in the n-type epitaxial layer including the channel is increased. (Vgs is unchanged. In other words, the n-type impurity concentration is increased while the channel thickness h is decreased.)

The n-type impurity concentration in the n-type epitaxial layer is changed to increase Emax as seen from expression (1), while W is decreased which is known from an expression (which is not shown above). Although a relation between withstand voltage Vdgmax and the n-type impurity concentration cannot be derived directly from the expressions described above, the relation may be determined as shown in FIG. 10. It is seen from FIG. 10 that withstand voltage Vdgmax decreases as the impurity concentration increases.

It is understood from the foregoing discussion that the direct decrease of the ON resistance of the lateral JFET degrades the breakdown voltage performance thereof.

DISCLOSURE OF THE INVENTION

One object of the present invention is to provide a lateral JFET structured to have an ON resistance which can be decreased while a high breakdown voltage performance thereof is maintained.

According to one aspect of the present invention, a lateral JFET includes a first semiconductor layer placed on a semiconductor substrate and containing impurities of a first conductivity type, a second semiconductor layer placed on the first semiconductor layer and containing impurities of a second conductivity type with a higher impurity concentration than that of the first semiconductor layer, a third semiconductor layer placed on the second semiconductor layer and containing impurities of the first conductivity type, source/drain region layers spaced from each other by a predetermined distance in the third semiconductor layer and containing impurities of the second conductivity type with a higher impurity concentration than that of the second semiconductor layer, and a gate region layer provided between the source/drain region layers in the third semiconductor layer, having its bottom surface extending into the second semiconductor layer and containing impurities of the first conductivity type with a higher impurity concentration than that of the second semiconductor layer.

The above-described structure is employed to achieve an electric field distribution which is a constant electric field similar to that of parallel-plate capacitors, instead of the electric field distribution of the normal junction (pn junction) between impurities of a first conductivity type and impurities of a second conductivity type. A decreased ON resistance is thus achieved with a breakdown voltage performance maintained, as compared with the lateral JFET of the conventional structure.

Preferably, according to the present invention, the second semiconductor layer and the third semiconductor layer have substantially the same impurity concentration. With this structure, the ON resistance is effectively decreased by the greatest degree with the withstand voltage maintained.

According to another aspect of the present invention, a lateral JFET includes a first semiconductor layer placed on a semiconductor substrate and containing impurities of a first conductivity type, a second semiconductor layer placed on the first semiconductor layer and containing impurities of a second conductivity type with a higher impurity concentration than that of the first semiconductor layer, source/drain region layers spaced from each other by a predetermined distance in the second semiconductor layer and containing impurities of the second conductivity type with a higher impurity concentration than that of the second semiconductor layer, and a gate region layer provided between the source/drain region layers in the second semiconductor layer and containing impurities of the first conductivity type with a higher impurity concentration than that of the second semiconductor layer.

The above-described structure is employed to achieve an electric field distribution which is a constant electric field similar to that of parallel-plate capacitors, instead of the electric field distribution of the normal junction (pn junction) between impurities of a first conductivity type and impurities of a second conductivity type. A decreased ON resistance is thus achieved with a breakdown voltage performance maintained, as compared with the lateral JFET of the conventional structure.

Preferably, according to the present invention, the distance between the top of the first semiconductor layer and the bottom of the gate region layer is smaller than the distance of a depletion layer extended by a built-in potential at junction between the second semiconductor layer and the gate region layer. With this structure, normally-off is achieved.

Preferably, according to the present invention, an impurity injection region is provided in the second semiconductor layer between the first semiconductor layer and the gate region layer, the impurity injection region having substantially the same impurity concentration and the same potential as those of the gate region layer. With this structure, the channel resistance is further decreased more effectively. Moreover, the ON resistance is further decreased.

Preferably, according to the present invention, one impurity injection region as described above is provided. With this structure, the effective channel thickness is increased and thus ON resistance is more effectively decreased.

Preferably, according to the present invention, the distance between the top of the impurity injection region and the bottom of the gate region layer is smaller than twice the distance of a depletion layer extended by a built-in potential at junction between the second semiconductor layer and the gate region layer, and the distance between the bottom of the impurity injection region and the top of the first semiconductor layer is smaller than the distance of a depletion layer extended by a built-in potential at junction between the second semiconductor layer and the impurity injection region. With this structure, normally-off is achieved.

Preferably, according to the present invention, at least two impurity injection regions as described above are provided. With this structure, the channel resistance is further decreased more effectively. Moreover, the ON resistance is further decreased.

Preferably, according to the present invention, the distance between the top of one of the impurity injection regions that is closest to the gate region layer among the impurity injection regions and the bottom of the gate region layer is smaller than twice the distance of a depletion layer extended by a built-in potential at junction between the second semiconductor layer and the gate region layer, the distance between the impurity injection regions is smaller than twice the distance of the depletion layer extended by the built-in potential at junction between the second semiconductor layer and the gate region layer, and the distance between the bottom of one of the impurity injection regions that is closest to the first semiconductor layer among the impurity injection regions and the top of the first semiconductor layer is smaller than the distance of a depletion layer extended by a built-in potential at junction between the second semiconductor layer and the impurity injection region. With this structure, normally-off is achieved.

According to a further aspect of the present invention, a lateral JFET includes a first semiconductor layer placed on a semiconductor substrate and containing impurities of a first conductivity type, a second semiconductor layer placed on the first semiconductor layer and containing impurities of a second conductivity type-with a higher impurity concentration than that of the first semiconductor layer, a third semiconductor layer placed on the second semiconductor layer and containing impurities of the first conductivity type, source/drain region layers spaced from each other by a predetermined distance in the third semiconductor layer and containing impurities of the second conductivity type with a higher impurity concentration than that of the second semiconductor layer, and a gate region layer provided between the source/drain region layers in the third semiconductor layer, including a region having its bottom surface extending into the first semiconductor layer and a region having its bottom surface extending into the second semiconductor layer, and containing impurities of the first conductivity type with a higher impurity concentration than that of the second semiconductor layer.

Preferably, according to the present invention, the second semiconductor layer and the third semiconductor layer have substantially the same thickness, and the third semiconductor layer has its impurity concentration substantially half that of the second semiconductor layer.

Preferably, according to the present invention, the third semiconductor layer has its thickness substantially half that of the second semiconductor layer, and the third semiconductor layer and the second semiconductor layer have substantially the same impurity concentration.

With this structure, the third semiconductor layer located between the gate region layer and the drain region layer as well as a part of the second semiconductor layer that is in contact with the third semiconductor layer all are changed into a depletion layer when a predetermined voltage is applied. Accordingly, the lateral JFET having a high withstand voltage is easily achieved without increase in thickness of the second semiconductor layer and increase in resistance.

According to a further aspect of the present invention, a lateral JFET includes a first semiconductor layer placed on a semiconductor substrate and containing impurities of a first conductivity type, a second semiconductor layer placed on the first semiconductor layer and containing impurities of a second conductivity type with a higher impurity concentration than that of the first semiconductor layer, a third semiconductor layer placed on the second semiconductor layer and containing impurities of the first conductivity type, a source region layer and a drain region layer spaced from each other by a predetermined distance in the third semiconductor layer and containing impurities of the second conductivity type with a higher impurity concentration than that of the second semiconductor layer, and a gate region layer provided between the source region layer and the drain region layer in the third semiconductor layer. The gate region layer, the second semiconductor layer and the third semiconductor layer have respective thicknesses and respective impurity concentrations that are determined to allow the third semiconductor layer located between the gate region layer and the drain region layer as well as a part of the second semiconductor layer that is in contact with the third semiconductor layer all to be changed into a depletion layer when a predetermined voltage is applied.

With this structure, the lateral JFET having a high withstand voltage is easily achieved without increase in thickness of the second semiconductor layer and increase in resistance.

BEST MODES FOR CARRYING OUT THE INVENTION

Figure 1:
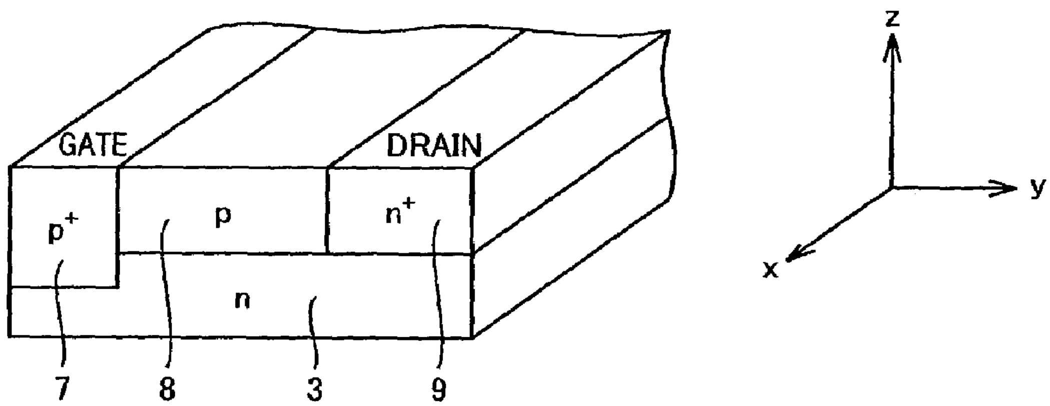
FIG. 1 is a schematic diagram for illustrating operating principles of a lateral JFET according to the present invention.

Embodiments of the present invention are now described in conjunction with the drawings. FIG. 1 is a schematic diagram for conceptually illustrating operating principles of the present invention. Although an electric field distribution between the gate and drain regions will be described with reference to FIG. 1, the same description is applicable to an electric field distribution between the gate and source regions. A lateral JFET according to the present invention has a basic structure including an n-type semiconductor layer 3 formed of an n-type impurity region and a p-type semiconductor layer 8 formed of a p-type impurity region on n-type semiconductor layer 3. Further, in this p-type semiconductor layer 8, there are provided a $p^+$-type gate region layer 7 extending into n-type semiconductor layer 3 and having a higher concentration of p-type impurities than the impurity concentration of n-type semiconductor layer 3 as well as an $n^+$-type drain region layer 9 placed with a predetermined distance from $p^+$-type gate region layer 7 and having a higher concentration of n-type impurities than the impurity concentration of n-type semiconductor layer 3.

An electric field distribution between $p^+$-type gate region layer 7 and $n^+$-type drain region layer 9 in this structure is hereinafter described.

A Poisson equation for n-type semiconductor layer 3 is represented by following expression (5):

$$\partial Ex/\partial x+\partial Ey/\partial y+\partial Ez/\partial z=-\rho/\epsilon \quad (5)$$

where

ρ represents a space charge density and ∈ represents a dielectric constant.

As Ex is equal to 0 (Ex=0), expression (5) can be represented as expression (6) below.

$$\partial Ey/\partial y=-\rho/\epsilon-\partial Ez/\partial z \quad (6)$$

An external voltage is applied to this structure in y direction, however, the depletion layer extends not only in y direction but also in z direction and accordingly expression (7) is substantially satisfied.

$$\partial Ez/\partial z=-\rho/\epsilon \quad (7)$$

Thus, a condition ∂Ey/∂y=0, namely Ey=constant is substantially satisfied. With the above-described structure, an electric field distribution is achieved that is a constant electric field similar to that of parallel-plate capacitors, instead of the electric field distribution observed for the normal pn junction. Accordingly, a decreased ON resistance is achieved while the breakdown voltage performance is maintained, as compared with the lateral JFET of the conventional structure. Embodiments are now described for a specific structure of a lateral JFET employing the above-discussed structure.

First Embodiment

Figure 2:
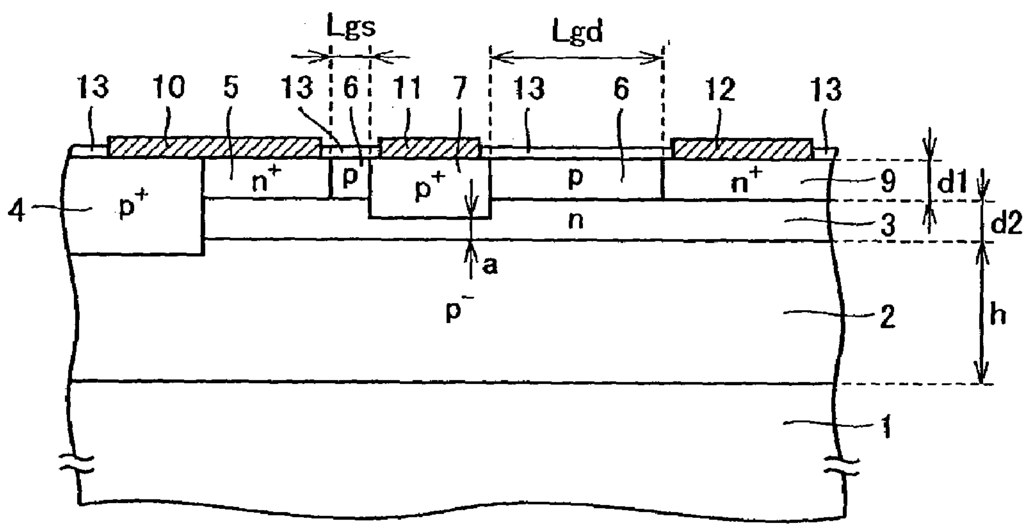
FIG. 2 is a cross sectional view showing a structure of a lateral JFET according to a first embodiment of the present invention.

Referring to FIG. 2, a structure of a lateral JFET is described according to this embodiment. The semiconductor substrate used here is a single crystal SiC substrate of any conductivity type. On this single crystal SiC substrate 1, a $p^-$-type epitaxial layer 2 which is a first semiconductor layer containing impurities of a first conductivity type is provided as shown in FIG. 2. On this p-type epitaxial layer 2, an n-type epitaxial layer 3 is provided that is a second semiconductor layer containing impurities of a second conductivity type with a higher concentration than that of $p^-$-type epitaxial layer 2. On this n-type epitaxial layer 3, a p-type epitaxial layer 6 is provided that is a third semiconductor layer.

In this p-type epitaxial layer 6, an $n^+$-type source region layer 5 and an $n^+$-type drain region layer 9 are provided at a predetermined distance therebetween that contain impurities of the second conductivity type with a higher concentration than the impurity concentration of n-type epitaxial layer 3. Further, between source region layer 5 and drain region layer 9, a $p^+$-type gate region layer 7 is provided that has its bottom surface extending into n-type epitaxial layer 3 and contains impurities of the first conductivity type with a higher concentration than the impurity concentration of n-type epitaxial layer 3.

A source electrode 10, a gate electrode 11 and a drain electrode 12 are provided respectively on respective surfaces of $n^+$-type source region layer 5, $p^+$-type gate region layer 7 and $n^+$-type drain region layer 9. A $p^+$-type semiconductor layer 4 is provided on one lateral side of source region layer 5.

It is supposed here that the lateral JFET with the structure described above has a withstand voltage of 500 V, n-type epitaxial layer 3 has a thickness of 1.0 μm, source region layer 5 and drain region layer 9 have a thickness (d) of 0.5 μm, p-type epitaxial layer 6 and n-type epitaxial layer 3 have the same impurity concentration of $1.2\times10^{17}$ $cm^{-3}$, and $p^-$-type epitaxial layer 2 has a thickness (h) of 3.0 μm and an impurity concentration of $1.0\times10^{16}$ $cm^{-3}$. Then, "Lgd" is 2.2 μm. For a normally-off type, "Lgs" is approximately equal to 0 and "a" is less than 160 nm ("a"<160 nm).

The structure of this embodiment provides an electric field distribution which is a constant electric field similar to that of parallel-plate capacitors, instead of the electric field distribution of the normal pn junction. Accordingly, as compared with the lateral JFET of the conventional structure, a decreased ON resistance is achieved while the withstand voltage is maintained.

In addition, the impurity concentration of the second semiconductor layer is made equal to that of the p-type epitaxial layer 6 to effectively decrease the ON resistance by the greatest degree while the withstand voltage is maintained.

Second Embodiment

Figure 3:
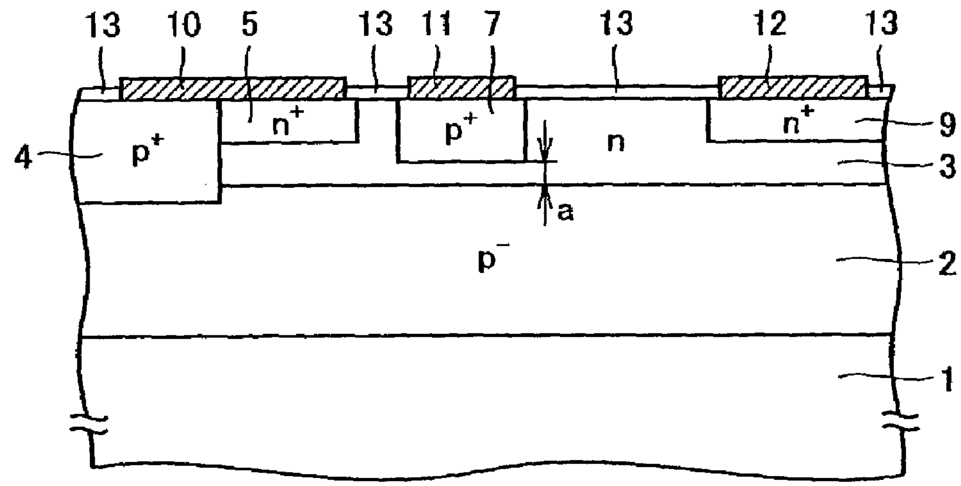
FIG. 3 is a cross sectional view showing a structure of a lateral JFET according to a second embodiment of the present invention.

Referring to FIG. 3, a structure of a lateral JFET according to this embodiment is now described. The above-discussed lateral JFET of the first embodiment has p-type epitaxial layer 6 provided on n-type epitaxial layer 3 and $n^+$-type source region layer 5, $n^+$-type drain region layer 9 and $p^+$-type gate region layer 7 are provided in this p-type epitaxial layer 6. According to the second embodiment, the lateral JFET does not include p-type epitaxial layer 6 on n-type-epitaxial layer 3 and has its $n^+$-type source region layer 5, $n^+$-type drain region layer 9 and $p^+$-type gate region layer 7 formed in n-type epitaxial layer 3. This structure is the same as that of the first embodiment except for the above-described details.

The structure as described above also provides an electric field distribution which is a constant electric field similar to that of parallel-plate capacitors, instead of the electric field distribution of the normal pn junction. Accordingly, a decreased ON resistance is achieved while the withstand voltage is maintained, as compared with the lateral JFET of the conventional structure.

Moreover, distance (a) between the top of $p^-$-type epitaxial layer 2 and the bottom of $p^+$-type gate region layer 7 is made smaller than the distance of a depletion layer extended by a built-in potential at the junction between n-type epitaxial layer 3 and $p^+$-type gate region layer 7. The depletion layer extended by the built-in potential causes complete pinchoff of the channel when the gate is 0 V and thus the normally OFF type is achieved.

Third Embodiment

Figure 4:
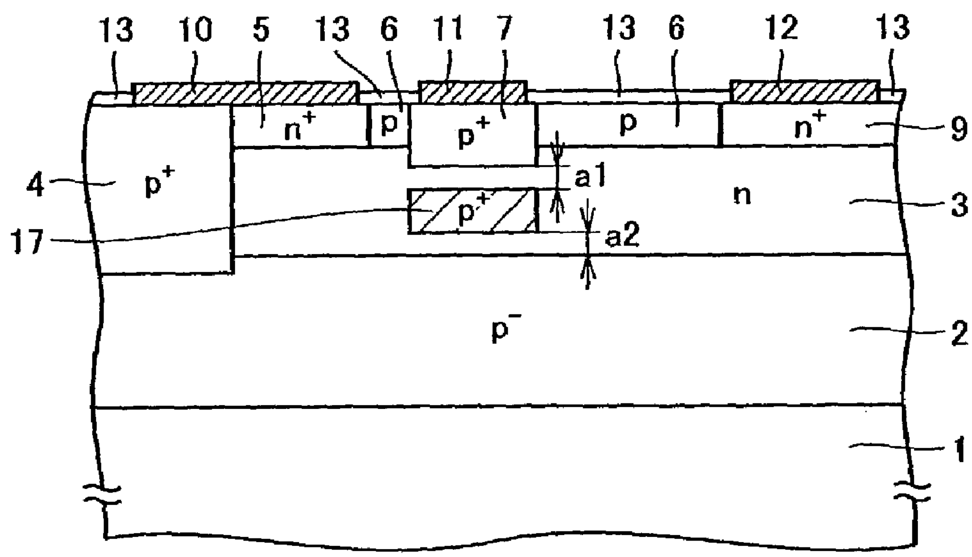
FIG. 4 is a cross sectional view showing a structure of a lateral JFET according to a third embodiment of the present invention.

Referring to FIG. 4, a structure of a lateral JFET according to this embodiment is described. The lateral JFET of this embodiment has the same basic structure as that of the first embodiment, and one feature of the third embodiment is that one impurity injection region 17 is provided, in n-type epitaxial layer 3, between $p^-$-type epitaxial layer 2 and $p^+$-type gate region layer 7, and this region 17 has almost the same impurity concentration and the same potential as those of $p^+$-type gate region layer 7.

This structure also provides an electric field distribution which is a constant electric field similar to that of parallel-plate capacitors, instead of the electric field distribution of the normal pn junction. Accordingly, a decreased ON resistance is achieved while the withstand voltage is maintained, as compared with the lateral JFET of the conventional structure.

Further, distance (a1) in this structure between the top of impurity injection region 17 and the bottom of $p^+$-type gate region layer 7 is made smaller than twice the distance of a depletion layer extended by a built-in potential at the junction between n-type epitaxial layer 3 and $p^+$-type gate region layer 7, and distance (a2) between the bottom of impurity injection region 17 and the top of $p^-$-type epitaxial layer 2 is made smaller than the distance of a depletion layer extended by a built-in potential at the junction between n-type epitaxial layer 3 and impurity injection region 17. Then, by the depletion layers extended by the built-in potential, complete pinchoff of the channel occurs when the gate is 0 V and thus the normally OFF type is achieved.

Fourth Embodiment

Figure 5:
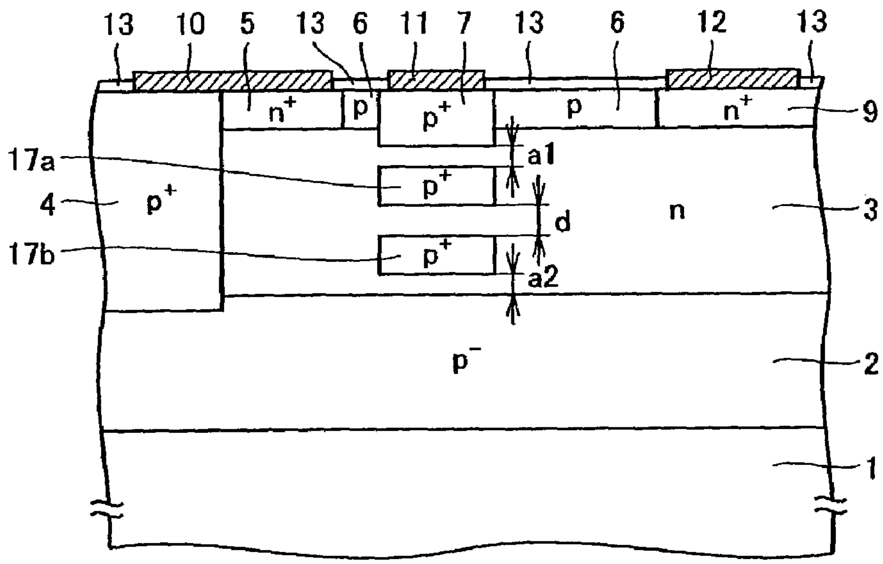
FIG. 5 is a cross sectional view showing a structure of a lateral JFET according to a fourth embodiment of the present invention.

Referring to FIG. 5, a structure of a lateral JFET according to this embodiment is described. The lateral JFET of this embodiment has the same basic structure as that of the lateral JFET of the above-discussed third embodiment, having a feature that a plurality of impurity injection regions 17*a* and 17*b* are provided, in n-type epitaxial layer 3, between $p^-$-type epitaxial layer 2 and $p^+$-type gate region layer 7, and the regions 17*a* and 17*b* have almost the same impurity concentration and the same potential as those of $p^+$-type gate region layer 7.

The structure as described above also provides an electric field distribution which is a constant electric field similar to that of parallel-plate capacitors, instead of the electric field distribution of the normal pn junction. Accordingly, a decreased ON resistance is achieved while the withstand voltage is maintained, as compared with the lateral JFET of the conventional structure.

Moreover, for the structure as described above, distance (a1) between the top of impurity injection region 17*a* that is closest to $p^+$-type gate region layer 7 among the impurity injection regions and the bottom of $p^+$-type gate region layer 7 is made smaller than twice the distance of a depletion layer extended by a built-in potential at the junction between n-type epitaxial layer 3 and $p^+$-type gate region layer 7, distance (d) between impurity injection regions 17*a* and 17*b* is made smaller than twice the distance of the depletion layer extended by the built-in potential at the junction between n-type epitaxial layer 3 and $p^+$-type gate region layer 7, and distance (a2) between the bottom of impurity injection region 17*b* that is closest to $p^-$-type epitaxial layer 2 among the impurity injection regions and the top of $p^-$-type epitaxial layer 2 is made smaller than the distance of a depletion layer extended by a built-in potential at the junction between n-type epitaxial layer 3 and impurity injection regions 17*a* and 17*b*. Thus, by the depletion layer extended by the built-in potential, complete pinchoff of the channel occurs when the gate is 0 V and accordingly the normally-OFF type is achieved.

Fifth Embodiment

A structure of a lateral JFET according to this embodiment is now described. For respective structures of the above-discussed embodiments, decrease of the impurity concentration of n-type epitaxial layer 3 and increase of the thickness thereof in the direction of the depth of the substrate are necessary for increasing the withstand voltage of the device. Then, a resultant problem is a sudden increase of the resistance of n-type epitaxial layer 3. In addition, when the thickness of n-type epitaxial layer 3 is increased in the direction of the depth of the substrate, a further problem of difficulty in control of the channel thickness occurs.

Figure 6:
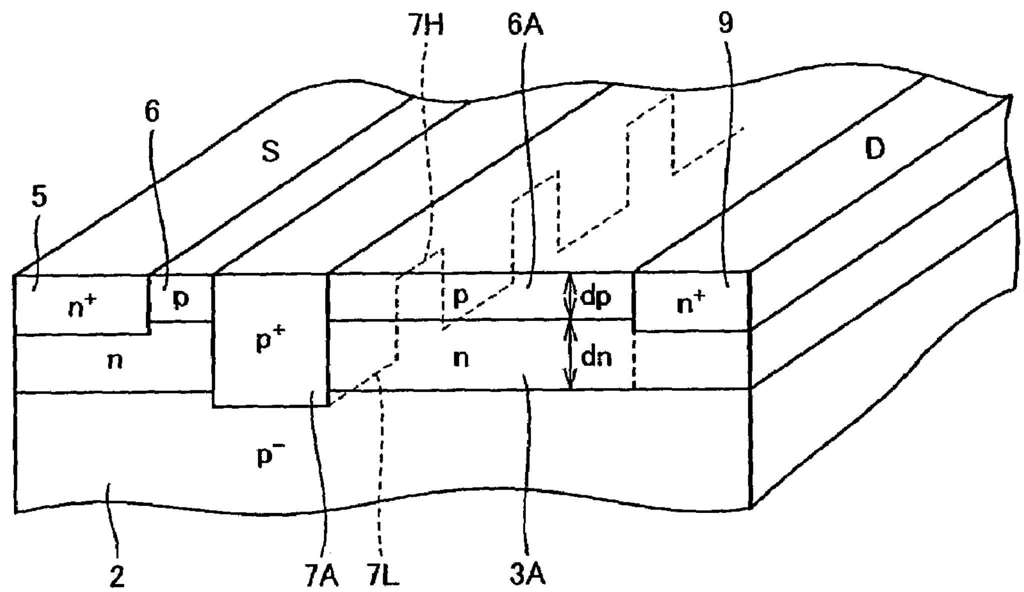
FIG. 6 is a cross sectional view showing a structure of a lateral JFET according to a fifth embodiment of the present invention.
Figure 7:
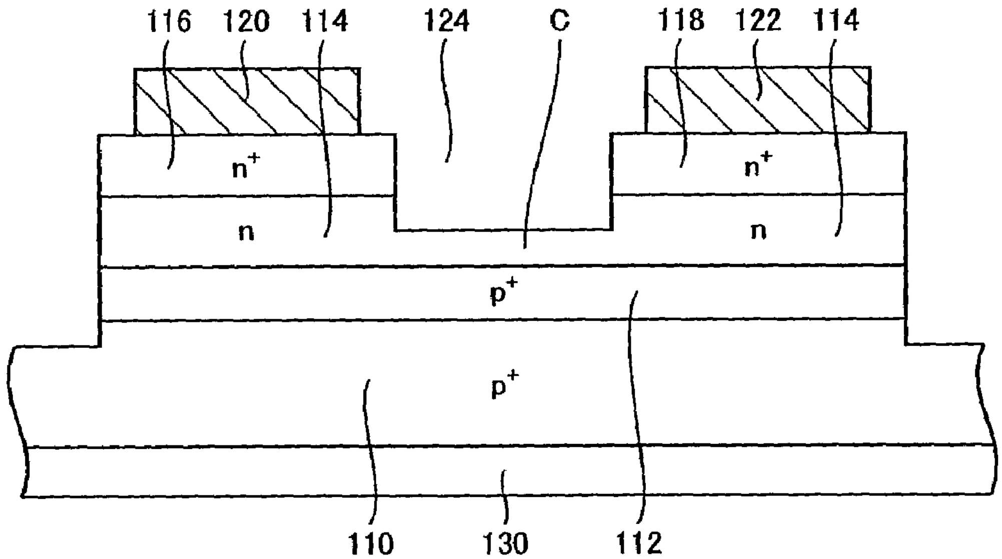
FIG. 7 is a cross sectional view showing a structure of a conventional lateral JFET.
Figure 8:
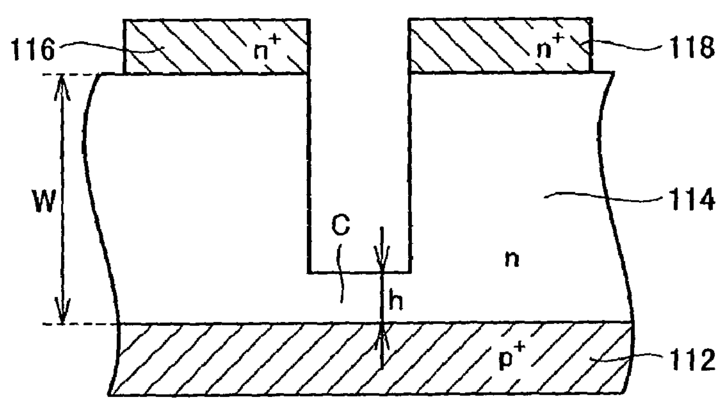
FIG. 8 schematically shows the conventional lateral JFET for evaluating the withstand voltage thereof.
Figure 9:
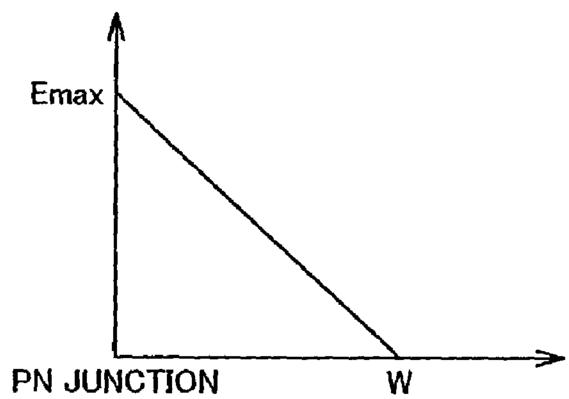
FIG. 9 shows an electric field distribution between the drain and gate at break down voltage.
Figure 10:
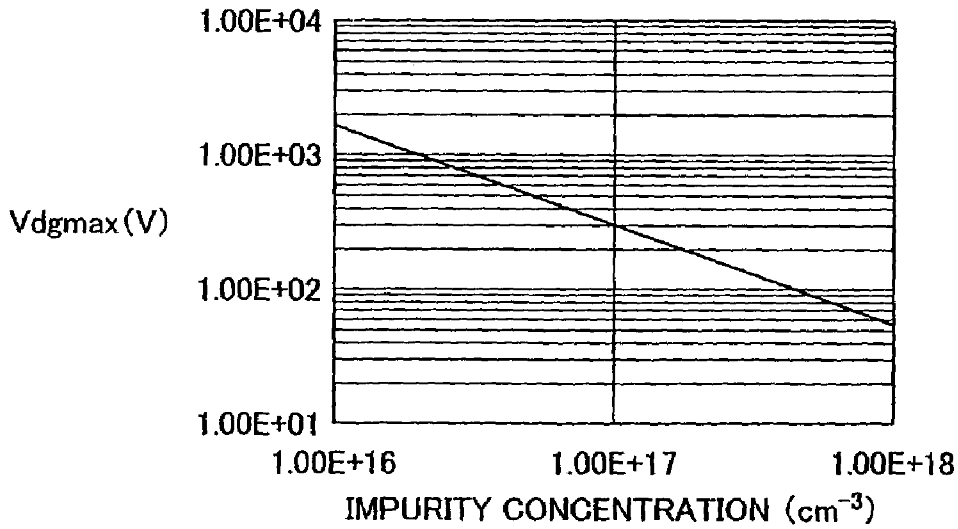
FIG. 10 shows a relation between maximum breakdown or withstand voltage Vdgmax applicable to a region between the drain and gate and the impurity concentration of the channel layer.

This embodiment is described below by being compared with the structure of the first embodiment, with reference to FIG. 6. It is noted here any component which is the same as that of the structure of the first embodiment is denoted by the same reference character and a detailed description thereof is not repeated.

For the lateral JFET of this embodiment, in order to change into a depletion layer, when a predetermined voltage is applied, all of a p-type epitaxial layer 6A between a $p^+$-type gate region layer 7A and $n^+$-type drain region layer 9 and a part of an n-type epitaxial layer 3A that is in contact with this p-type epitaxial layer 6A, respective impurity concentrations and respective thicknesses in the direction of the depth of the substrate of $p^+$-type gate region layer 7A, n-type epitaxial layer 3A and p-type epitaxial layer 6A are selected.

Moreover, p-type epitaxial layer 6A has its impurity concentration (NA) and thickness (dp) in the direction of the depth of the substrate, n-type epitaxial layer 3A has its impurity concentration (ND) and thickness (dn) in the direction of the depth of the substrate, and these concentrations and thicknesses are defined to have the following relation. If the thicknesses have a relation dp=dn, the concentrations have a relation 2NA=ND. If the thicknesses have a relation 2dp=dn, the concentrations have a relation NA=ND.

Specifically, according to this embodiment, $p^+$-type gate region layer 7A includes, in the direction in which $p^+$-type gate region layer 7A extends (X direction of the substrate, see FIG. 1), a region 7L provided to reach $p^-$-type epitaxial layer 2 and a region 7H provided to reach n-type epitaxial layer 3A.

The structure satisfying the relation above is employed to change into a depletion layer, when a predetermined voltage is applied, all of the p-type epitaxial layer 6A located between $p^+$-type gate region layer 7A and $n^+$-type drain region layer 9 and a part of n-type epitaxial layer 3A that is in contact with p-type epitaxial layer 6A. Accordingly, without increase in thickness of n-type epitaxial layer 3A and increase in resistance, a lateral JFET having a high withstand voltage is achieved.

While the embodiments of the present invention have been described above, the embodiments disclosed above are by way of illustration and example only and the scope of the present invention is not limited to these embodiments, The scope of the present invention is set forth in the appended claims and it is intended that the same includes all of modifications and variations equivalent in the meaning and within the scope of the invention.

INDUSTRIAL APPLICABILITY

According to the present invention, a lateral JFET is provided that has a decreased ON resistance while maintaining a high breakdown voltage-performance.

The invention claimed is:

1. A lateral junction field-effect transistor comprising:

a first semiconductor layer (2) placed on a semiconductor substrate (1) and containing impurities of a first conductivity type (p);

a second semiconductor layer (3) placed on said first semiconductor layer (2) and containing impurities of a second conductivity type (n) with a higher impurity concentration than that of said first semiconductor layer (2);

a third semiconductor layer (6) placed on said second semiconductor layer (3) and containing impurities of the first conductivity type (p);

source/drain region layers (5, 9) spaced from each other by a predetermined distance in said third semiconductor layer (6) and containing impurities of the second conductivity type (n) with a higher impurity concentration than that of said second semiconductor layer (3);

a gate region layer (7) provided between said source/drain region layers (5, 9) in said third semiconductor layer (6), having its bottom surface extending into said second semiconductor layer (3) and containing impurities of the first conductivity type (p) with a higher impurity concentration than that of said second semiconductor layer (3); and an impurity injection region (17, 17*a*, 17*b*) provided in said second semiconductor layer (3) between said first semiconductor layer (2) and said gate region layer (7), said impurity injection region having substantially the same impurity concentration and the same potential as those of said gate region layer (7).

2. The lateral junction field-effect transistor according to claim 1, wherein one said impurity injection region (17) is provided.

3. The lateral junction field-effect transistor according to claim 2, wherein the distance between the top of said impurity injection region (17) and the bottom of said gate region layer (7) is smaller than twice the distance of a depletion layer extended by a built-in potential at junction between said second semiconductor layer (3) and said gate region layer (7), and the distance between the bottom of said impurity injection region (17) and the top of said first semiconductor layer (2) is smaller than the distance of a depletion layer extended by a built-in potential at junction between said second semiconductor layer (3) and said impurity injection region (17, 17*a*, 17*b*).

4. The lateral junction field-effect transistor according to claim 1, wherein at least two said impurity injection regions (17*a*, 17*b*) are provided.

5. The lateral junction field-effect transistor according to claim 4, wherein the distance between the top of one (17*a*) of said impurity injection regions that is closest to said gate region layer (7) among said impurity injection regions and the bottom of said gate region layer (7) is smaller than twice the distance of a depletion layer extended by a built-in potential at junction between said second semiconductor layer (3) and said gate region layer (7), the distance between said impurity injection regions (17*a*, 17*b*) is smaller than twice the distance of the depletion layer extended by the built-in potential at junction between said second semiconductor layer (3) and said gate region layer (7), and the distance between the bottom of one (17*b*) of said impurity injection regions that is closest to said first semiconductor layer (2) among said impurity injection regions and the top of said first semiconductor layer (2) is smaller than the distance of a depletion layer extended by a built-in potential at junction between said second semiconductor layer (3) and said impurity injection region (17*b*).

6. A lateral junction field-effect transistor comprising:

a first semiconductor layer (2) placed on a semiconductor substrate (1) and containing impurities of a first conductivity type (p);

a second semiconductor layer (3) placed on said first semiconductor layer (2) and containing impurities of a second conductivity type (n) with a higher impurity concentration than that of said first semiconductor layer (2);

source/drain region layers (5, 9) spaced from each other by a predetermined distance in said second semiconductor layer (3) and containing impurities of the second conductivity type (n) with a higher impurity concentration than that of said second semiconductor layer (3);

a gate region layer (7) provided between said source/drain region layers (5, 9) in said second semiconductor layer (3 and containing impurities of the first conductivity type (p) with a higher impurity concentration than that of said second semiconductor layer (3); and an impurity injection region (17, 17*a*, 17*b*) provided in said second semiconductor layer (3) between said first semiconductor layer (2) and said gate region layer (7), said impurity injection region having substantially the same impurity concentration and the same potential as those of said gate region layer (7).

* * * * *

UNITED STATES PATENT AND TRADEMARK OFFICE

CERTIFICATE OF CORRECTION

PATENT NO. : 7,023,033 B2
APPLICATION NO. : 10/362345
DATED : April 4, 2006
INVENTOR(S) : Harada et al.

It is certified that error appears in the above-identified patent and that said Letters Patent is hereby corrected as shown below:

Column 4,
Line 47, replace “type-with”, by --type with--.

Column 7,
Line 2, replace “p-type”, by --$p^-$ -type--.
Line 59, replace “n-type-epitaxial”, by --n-type epitaxial--

Column 9,
Switch the order of the paragraph at lines 43 to 52 with the paragraph at lines 53 to 58.

Column 10,
Line 14, replace “voltage-performance”, by --voltage performance--.

Column 12,
Line 15, replace “(3”, by --(3)--.

Signed and Sealed this

Twenty-first Day of November, 2006

JON W. DUDAS
*Director of the United States Patent and Trademark Office*